United States Patent
Srinivasan et al.

(10) Patent No.: US 7,350,174 B2
(45) Date of Patent: Mar. 25, 2008

(54) METHOD AND APPARATUS FOR LAYOUT SYNTHESIS OF REGULAR STRUCTURES USING RELATIVE PLACEMENT

(75) Inventors: Vinoo N. Srinivasan, Santa Clara, CA (US); Veerapaneni Nagbhushan, Saratoga, CA (US); Kumar Lalgudi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 10/881,954

(22) Filed: Jun. 29, 2004

(65) Prior Publication Data

US 2004/0243963 A1  Dec. 2, 2004

Related U.S. Application Data

(62) Division of application No. 10/039,637, filed on Dec. 31, 2001, now Pat. No. 6,757,878.

(51) Int. Cl.
  *G06F 17/50* (2006.01)
(52) U.S. Cl. .................................................. 716/10
(58) Field of Classification Search ............ 716/10
  See application file for complete search history.

(56) References Cited

U.S. PATENT DOCUMENTS 5,097,422 A  *  3/1992  Corbin et al. .................. 716/8
5,838,583 A      11/1998  Varadarajan et al.
6,237,139 B1      5/2001  Patterson et al.
6,243,851 B1      6/2001  Hwang et al.
6,567,967 B2      5/2003  Greidinger et al.
6,594,808 B1      7/2003  Kale et al.

FOREIGN PATENT DOCUMENTS

EP          0294188          12/1988

* cited by examiner

*Primary Examiner*—Jack Chiang
*Assistant Examiner*—Brandon Bowers
(74) *Attorney, Agent, or Firm*—Cindy T. Faatz (57) ABSTRACT

Layout synthesis of regular structures using relative placement. Relative placement constraint information is received. The relative placement constraint information indicates a relative placement of a plurality of layout objects with respect to each other, wherein at least a first one of the plurality of layout objects may be at a different level of hierarchy in the layout than at least a second one of the plurality of layout objects. The plurality of layout objects is then automatically placed according to the relative placement constraint information.

33 Claims, 6 Drawing Sheets

| SPECIFICATION | IMPLICATION |
|---|---|
| (1) V1 = vector{a(0:9)} | |
| (2) V2 = vector (stride 2) {b(0:4)} | |
| (3) V3 = vector{c(0,5,6:8) d(0:3:2)} | |
| (4) V4 = vector{skip(2) j(0:1)} | |
| (5) V5 = step{interleave{v3 v4} i[(0)]} | |
| (6) V6 = merge{V1 V2} | |
| (7) V7 = interleave {vector{Tall(0:4)} merge{vector{x(0:4)} vector{y(0:4)}} | |
| (8) hg = Vabut{V6 step{v7 zzinst}} | |

METHOD AND APPARATUS FOR LAYOUT SYNTHESIS OF REGULAR STRUCTURES USING RELATIVE PLACEMENT

CROSS-REFERENCE TO RELATED APPLICATION

The present application is a divisional application of U.S. patent application Ser. No. 10/039,637, filed on Dec. 31, 2001, now U.S. Pat. No. 6,757,878, also assigned to the assignee of the present application.

BACKGROUND

1. Field

An embodiment of the present invention relates to the field of integrated circuit design tools and, more specifically, to a method and apparatus for layout synthesis using relative placement.

2. Discussion of Related Art

Timing convergence of layouts with a given area constraint is a difficult problem for many integrated circuit designs. Current approaches may involve numerous time consuming iterations between circuit design, place and route, and timing analysis. This process can be both slow and non-deterministic resulting in project management uncertainties.

As a specific example, there are currently two primary approaches for datapath layout—purely manual and fully automatic. Where a manual layout approach is used, mask designers may lay out entire functional blocks by hand, for example. While a manual layout approach provides a high degree of control, it is very time consuming and may not be feasible for very large designs.

Automatic placement tools, on the other hand, are capable of handling large designs, but their use may result in increased difficulty achieving timing convergence and may limit the degree of control the designer has over the resulting layout. This is because, in order to automate the layout process, such tools are designed to make automatic judgments and assumptions based on the input data. In some cases, these assumptions may be incorrect or may otherwise not capture the intent of the designer in producing a layout.

One reason this may occur is that conventional automatic placement tools typically only include a small number and range of user controls to provide for the designer to constrain the input data to achieve a desired placement result. In many cases, for example, the user is limited to specifying timing constraints indirectly as net weights or net/path constraints. In this manner, the effects of an adjustment to one of these constraints may be difficult to anticipate. Thus, several iterations and tweaking of these indirect constraints may be required to achieve timing convergence using the automated tool. Alternatively, the designer may instead resort to manual adjustments, which can be time consuming.

Another issue may arise when there are changes in cell sizes due to, for example, engineering changes and/or process shifts. Using process shifts as a specific example, layout compaction is often used, but has some shortcomings. Straight compaction may be inefficient under tight area constraints and may not honor the designers' original intent during re-synthesis. For multiple generations of design re-use, the designers' intent may be lost completely resulting in issues ranging from performance penalties to inefficient area use.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for layout synthesis of regular structures using relative placement is described. In the following description, particular types of systems, functional unit blocks, instructions, groups of objects, etc. are described for purposes of illustration. It will be appreciated, however, that other embodiments are applicable to other types of systems, functional unit blocks, instructions and object groupings, for example.

Figure 1:
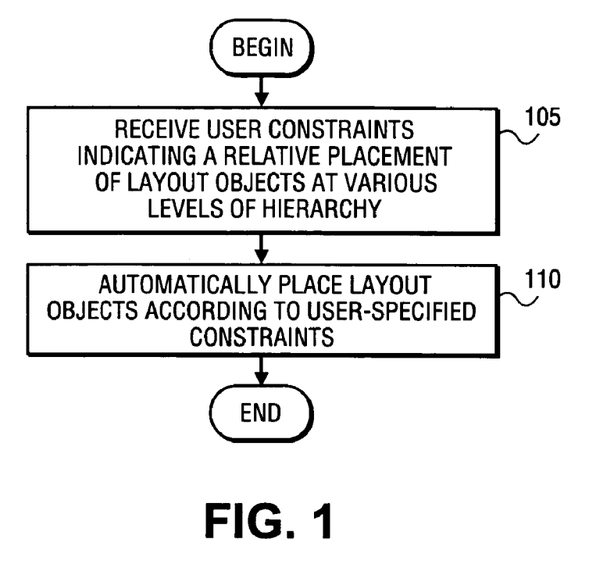
FIG. 1 is a flow diagram showing a method of one embodiment for producing a layout using the relative placement approach of one embodiment.

For one embodiment, as shown in FIG. 1, at block 105, relative placement constraints indicating a relative placement of multiple integrated circuit layout objects with respect to each other are received. At least one of the layout objects specified in the constraints may be at a different level of hierarchy in the layout than at least another one of the specified layout objects. In other words, for one embodiment, the capability is provided to represent and handle relative placement constraints between physical objects and/or components at different level of logical netlist hierarchy. At block 110, the layout objects are placed according to the relative placement constraints.

Using the relative placement approach of one embodiment, the intent of the integrated circuit designers may be more easily captured by the input data such that timing synthesis may be more straightforward. Further, for one embodiment, the user constraint information from an original design may be used in producing a layout for a design proliferation such as a process shrink. In this manner, the number of placement iterations required to achieve timing convergence may be reduced as compared to a straight layout compaction, for example. Further details of this and other embodiments are provided in the description that follows.

In the following description, relative orientation and placement terminology, such as the terms horizontal, vertical, left, right, top and bottom, is used. It will be appreciated that these terms refer to relative directions and placement in a two dimensional layout with respect to a given orientation of the layout. For a different orientation of the layout, different relative orientation and placement terms may be used to describe the same objects or operations.

Figure 2:
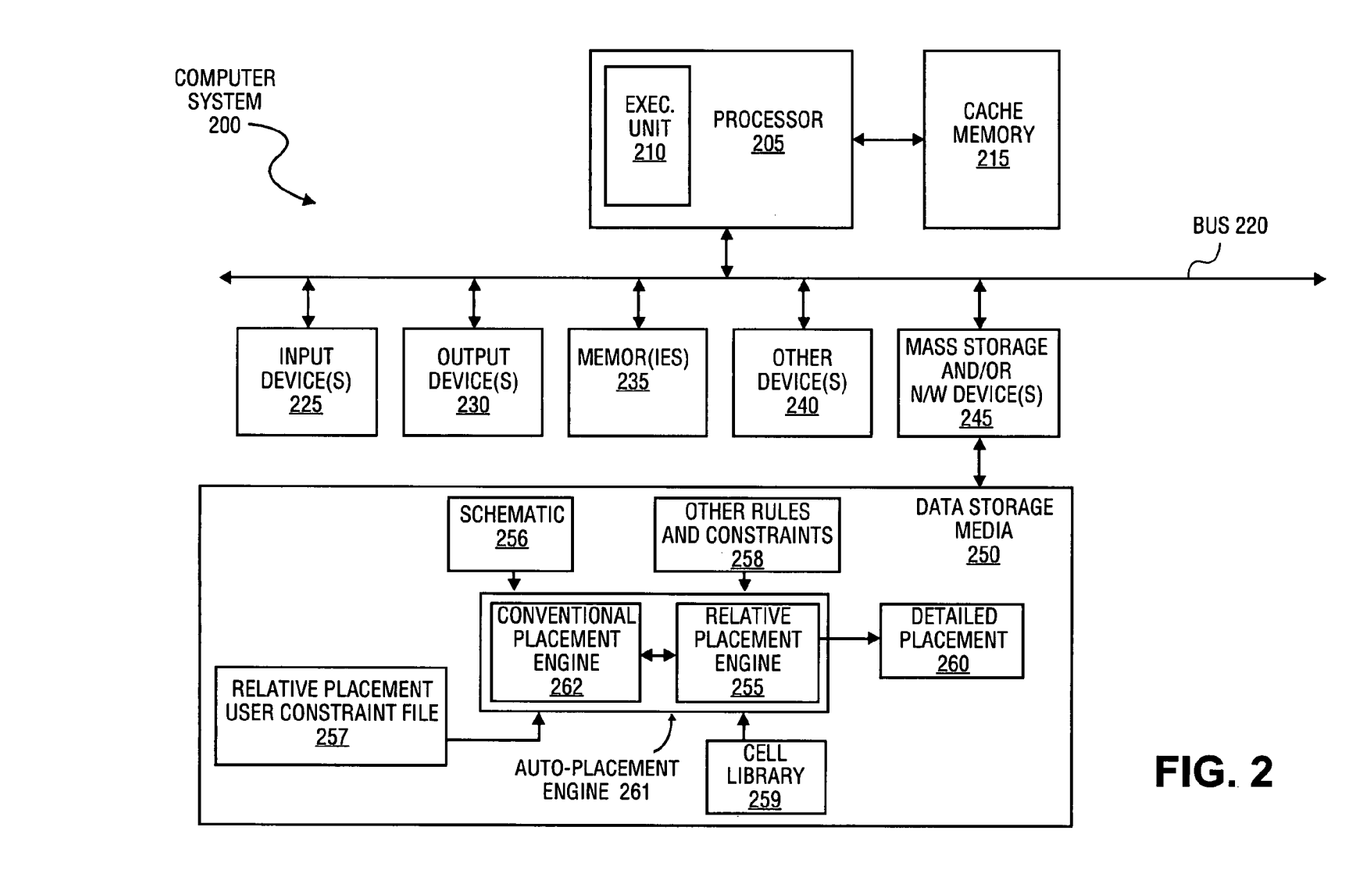
FIG. 2 is a block diagram of a computer system in which the relative placement approach of one embodiment may be implemented.

FIG. 2 is a block diagram of a computer system 200 in which the relative placement method and apparatus of one embodiment may be advantageously implemented. For this embodiment, the computer system 200 is a workstation computer system such as a Hewlett Packard HP 9000 Enterprise Server manufactured by Hewlett Packard Company of Palo Alto, Calif. Other types of workstations and/or other types of computers and/or computer systems are within the scope of various embodiments.

The computer system 200 includes a processor 205 to execute instructions using an execution unit 210. A cache memory 215 may be coupled to or integrated with the processor 205 to store recently and/or frequently used instructions. The processor 205 is coupled to a bus 220 to communicate information between the processor 205 and other components in the computer system 200.

Also coupled to the bus 220 are one or more input devices 225, such as a keyboard and/or a cursor control device, one or more output devices 230, such as a monitor and/or printer, one or more memories 235 (e.g. random access memory (RAM), read only memory (ROM), etc.), other peripherals 240 (e.g. memory controller, graphics controller, bus bridge, etc.), and one or more mass storage devices and/or network connectivity devices 245.

The mass storage device(s) and/or network connectivity devices 245 may include a hard disk drive, a compact disc read only memory (CD ROM) drive, an optical disk drive and/or a network connector to couple the computer system 200 to one or more other computer systems or mass storage devices over a network, for example. Further, the mass storage device(s) 245 may include additional or alternate mass storage device(s) that are accessible by the computer system 200 over a network (not shown).

A corresponding data storage medium (or media) 250 (also referred to as a computer-accessible storage medium) may be used to store instructions, data and/or one or more programs to be executed by the processor 200. For one embodiment, the data storage medium (or media) 250 stores information, instructions and/or programs 255-262 that are used to perform layout synthesis. For this exemplary embodiment, a relative placement engine 255 receives an integrated circuit schematic 256, a relative placement constraint file 257, other rules and constraints 258 and a cell library 259.

Responsive to the information received, the relative placement engine 255 produces a detailed placement 260 for the layout objects included in the selected cell(s) according to the relative placement constraints 257 specified for some or all of the objects. For some embodiments, the relative placement engine 255 may be included as part of an automatic placement engine 261 that also includes a conventional placement engine 262. The relative placement engine 255 and user constraint specification 257 are each described in more detail below.

For one embodiment, the other rules and constraints 258 may include, for example, design and/or process rules and/or design style and placement methodology-related constraints. Details of the design style and placement methodology-related constraints may be determined, at least in part, by the manner in which the wells are aligned between adjacently placed cells.

Typically, data and control flow directions in a functional unit block (FUB) or other sub-unit of an integrated circuit are orthogonal to each other. Integrated circuit units may be referred to herein as being standard or rotated depending on whether the data flow direction is viewed as being North/South (vertical) or East/West (horizontal), respectively. Units for which the well alignment is in the data flow direction are referred to herein as data-aligned units and units for which the well alignment is in the control flow direction are referred to as control-aligned units. The corresponding design styles are referred to herein as data-aligned and control-aligned. It will be appreciated that other types of rules and constraints may also be included in the file 258.

The cell library 259 is a database of cell-specific files. For one embodiment, these files include information such as bit pitch and number of bit slices for a particular leafcell. Other types of cell-specific information and/or information for other types of cells may also or alternatively be included.

t will be appreciated by one of ordinary skill in the art that, while FIG. 2 represents the data storage media 250 as a single block, for many embodiments, multiple data storage media may be used to store the information and/or instructions 255-260 and/or some of the information and/or instructions indicated by the blocks 255-260 may be accessible to computer system 200 over a network (not shown).

The method of one embodiment for performing layout synthesis using relative placement is described with reference to FIGS. 2-5. While the following exemplary embodiments refer to layout synthesis for a datapath, another type of regular structure may also benefit from various embodiments.

Figure 3:
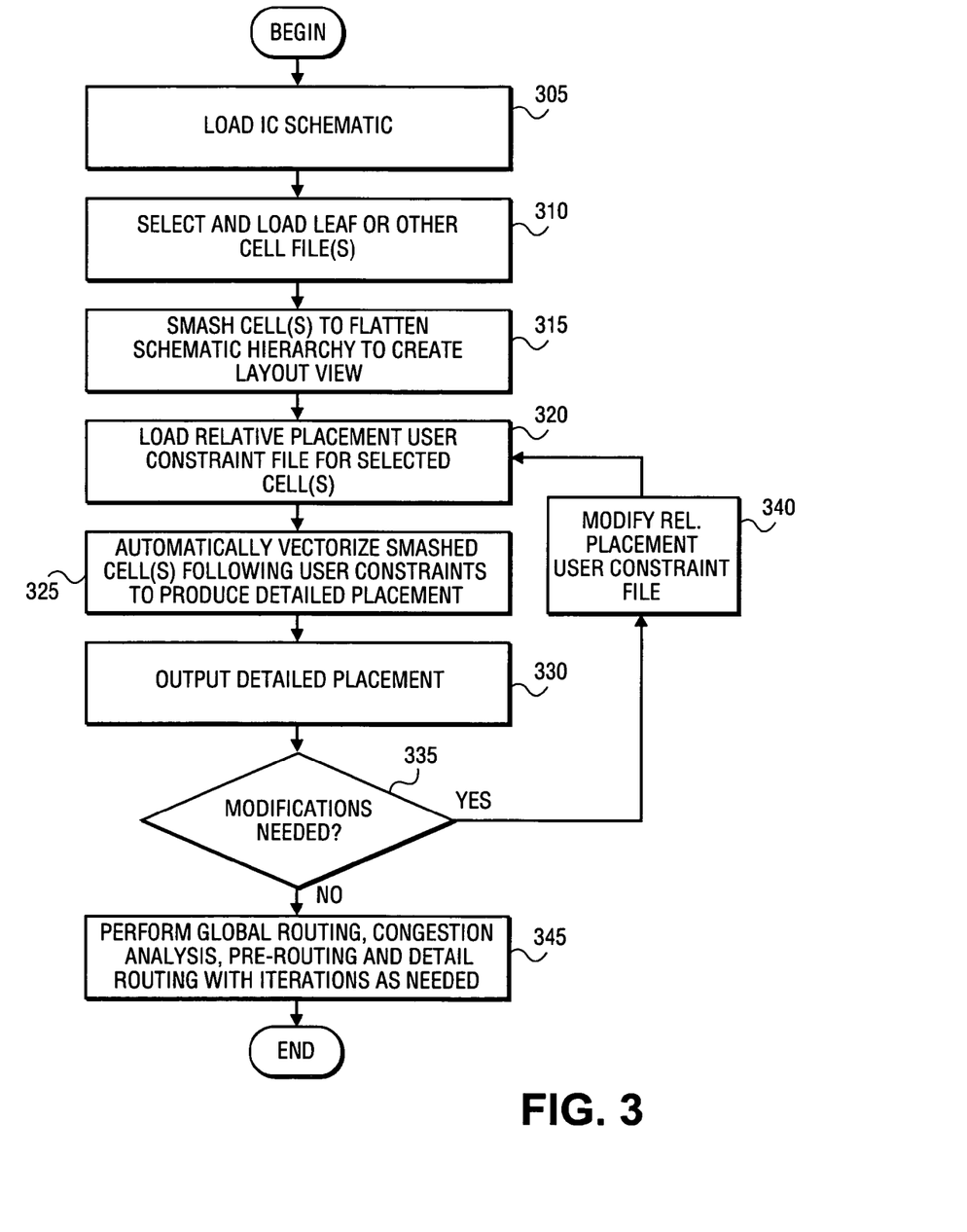
FIG. 3 is a flow diagram showing the method of one embodiment for producing a layout using the relative placement approach of one embodiment.

In FIG. 3, at block 305, a schematic of interest 256 is loaded for processing by the relative placement engine 255. For one embodiment, placement is performed for an integrated circuit device one cell at a time, where a cell may be substantially any sub-unit of the integrated circuit. In fact, for one embodiment, relative placement as described below may be specified for cell(s) at every level of hierarchy from full-chip to macro-cells within functional unit blocks. Thus, at block 305 for this embodiment, the schematic for the particular cell of interest, referred to herein as a topcell, may be loaded.

At block 310, one or more cell files corresponding to cells included within the selected topcell, referred to herein for one embodiment as leafcells, are loaded from the cell library 259 and at block 315, the schematic hierarchy for the cell is smashed to create a layout view for use by the placement engine 261. For one embodiment, this layout view is flat. For other embodiments, the layout view may be in the form of a multi-level hierarchy such that multiple levels of hierarchy may be placed simultaneously. For one embodiment, flattening of the cell schematic is performed by one of the placement engines 255, 261 or 262 or another engine (not shown) that is coupled to the relative placement engine 255.

At block 320, one or more relative placement user constraint files 257 for the selected topcell are loaded for use by the relative placement engine 255. The relative placement user constraint file(s) contains user-specified constraints for relative placement of layout objects included within the topcell. For one embodiment, the relative placement user constraint file(s) is developed using a programming language that includes an extensive set of relative placement operators.

For illustrative purposes, some characteristics of an exemplary relative placement user constraint file 257 that may be used in producing a placement by the relative placement engine 255 are described below. While specific syntax and operators are used as examples, one of ordinary skill in the art will appreciate that other syntax styles and other types of relative placement and related operators are within the scope of various embodiments.

For one embodiment, for example, the relative placement user constraint file 257 may include both global options to be applied to processing of the entire topcell as well as object-specific constraints to be applied to specified layout objects within the topcell. Further, the user may specify both relative placement and absolute placement constraints, each of which may be applied to one or more levels of hierarchy within the layout. Additional user specifications may be included in the relative placement user constraint file 257 such as re-mapping of instance names and specification of other types of constraints.

For one embodiment, global options may include any option or constraint to control operation of the relative placement engine 255 during automatic vectorization for a particular topcell. Examples of the types of global options that may be specified in the relative placement user constraint file 257 or another constraint file include specifying a boundary and/or origin for the topcell, indicating whether text case sensitivity is to be preserved and/or specifying the number of bits in the datapath, the orientation of the unit (e.g. standard or rotated), the well alignment direction (data or control), and/or the rowsite height for control-aligned objects, for example.

Other global options or constraints that may be specified include a bit structure to be applied to the entire cell. For one embodiment, for example, the relative placement engine 255 provides the designer with the flexibility to specify a bit structure with a complex recurring bitpitch pattern that may have varying bitpitch and/or multiple sub-column designs within each bitpitch.

While global options are globally applied, object-specific constraints are applied only to the specified objects. For one embodiment, an object may be one of three types: an instance, a vector or a group.

As the terms are used herein, an instance is an atomic object to the placement engine(s) and is the basic building block for the placement. For one embodiment, each instance has a well-defined bounding box that is either estimated or pre-specified.

A vector is a list of bussed or individual instances, each occupying a unique bit location in the datapath. Instances in control-aligned units or cells are aligned so their n-wells match. Instances in data-aligned designs are aligned based on a parameter such as a justify parameter discussed in more detail below.

A group is a collection of instances, vectors and/or other groups that are to be placed together. Thus, a group may be at any one of a number of levels of hierarchy. Layout hierarchy, as the term is used herein, refers to different levels of granularity for the layout. For example, an instance is an atomic object as described above, and therefore, is at the lowest level of the layout hierarchy. A vector is a list of instances and, therefore, is at a higher level of hierarchy. A group that includes that vector is at an even higher level of hierarchy and so on.

For one embodiment, a group may be a hard group or a soft group. For a hard group, the relative placement constraints for all the objects in the group are well-specified. In contrast, for a soft group, relative placement constraints are not specified for all objects in the group. The soft group is a simple collection of groups (hard or soft), vectors and/or instances that are placed together.

For one embodiment, in addition to relative placement constraints, various other types of properties to be used during placement can be specified for groups and/or vectors and processed by the relative placement engine 255. Some of these properties are similar or identical to properties that may be specified as global options. For these cases, the object-specific properties take precedence for one embodiment. Where an object-specific property is not specified, the corresponding global property is applied.

Examples of object-specific properties that may be specified for one embodiment include span and bit structure, well alignment style, rowsite height, stride, alignment guidelines, height and width or other boundary constraints, and rigidness. Other qualifying properties that may be specified with respect to specific objects include whether the object is to be flipped, folded, or split.

Span refers to the number of bits in the respective vector or group. A bit structure different from the globally-specified bit structure may be specified for individual vectors and/or groups. For one embodiment, for groups, the bit structure may be inferred as a result of the operation performed to form the group as described in more detail below. For example, if two vectors with different bit pitch values are concatenated, a longer, multi-bit pitch group is generated.

The well alignment object-specific property is similar to the well alignment global property discussed above and is either data-aligned or control-aligned for one embodiment. In this manner, specific groups or vectors may have a different alignment style than the globally-specified style.

Row site height for one embodiment is used only for control-aligned objects and ignored for data-aligned objects. For control-aligned groups, each group has a list of row sites and row site information is stored as part of the group. For soft groups, the row site height may be specified as a user constraint. For other groups, however, row site height information may be generated as a result of relative placement operations and the specific vectors and groups that are being operated on.

The stride indicates the frequency of instances across bit positions. For one embodiment, the default stride is 1 such that an instance is placed at each bit position in the cell being operated on. Other strides may be specified for certain vectors and groups that may have another uniform stride. For example, for a stride of two, every other bit position is empty.

A justify property may be used to specify a desired alignment for objects that are placed in order in the horizontal or vertical direction, for example. For one embodiment, for objects placed in the horizontal direction, the default is to align the bottom edges of (bottom justify) the objects. Other options that may be specified for horizontally ordered objects include top, center and net-name justification. Objects ordered vertically are placed such that they are left justified by default, i.e. their leftmost edges are aligned. Other options for vertically ordered objects include right, center and net-name justification.

For this embodiment, when a net-name is specified for justification, the objects in the related vector or group are placed such that the pins on the various objects related to the specified net are all aligned on a straight line. This option is useful, for example, for data-aligned units where instances in a vector can be aligned based on a control net. For one embodiment, particularly for control-aligned units, however, the well alignment property takes priority over the justify property.

The height and width or other boundary property may be used, for example, to define a bounding box for a soft group. For this example, all objects in a soft group are then placed within the defined bounding box.

The rigidness property may be used identify particular objects to be non-rigid. For one embodiment, the relative placement engine 255 creates a cell placement in a constructive manner using a top down descent and bottom up constructive ascend. By default, all vectors are rigid and all groups are created rigid unless otherwise specified, i.e. the relative placement relationships of their contents are considered to be relatively fixed while constructing their respective parent object.

Additionally, for one embodiment, an object may be flipped around a specified axis by a specified amount to create a rotated object or a mirror image of the object. Further, where there are space constraints, it may be desirable to fold the object into two or more vectors of similar length across multiple rows or split the object across multiple columns or bit positions.

To specify the relative placement of objects and/or to form groups and/or vectors, relative placement operators are used for one embodiment. Examples of such relative placement operators may include horizontal step, vertical step, horizontal abut, vertical abut, interleave and merge operators each of which is described in more detail below. For one embodiment, horizontal step, vertical step, horizontal abut and vertical abut operators operate on a list of instances, vectors and/or groups while interleave and merge operators operate on a list of groups and/or vectors. By default, a list of objects in the input list associated with these operators may be considered to be ordered. Optionally, for one embodiment, an order parameter may be set false to identify a list of inputs to which no order significance is attached.

Also for one embodiment, all of these operators return a new group as a result of the specified operation. A newly formed group that is formed in this manner is by default a hard group because the related operation generates a relative placement of the objects in the input list. Further, as mentioned above, for one embodiment, the new group may be rigid by default, but may be explicitly identified as being non-rigid where desired.

The horizontal and vertical abut operators cause the relative placement engine 255 to stack a list of objects either horizontally or vertically, respectively. If the list is an ordered list, adjacent objects in the list are placed abutting each other. For one embodiment, a horizontal abut operation causes the newly formed object to grow from left to right while the vertical abut operation causes the object to grow from bottom to top. Different default constructions may be used for other embodiments.

Where the input list of objects is unordered, the relative placement engine 255 determines the best order in which to place the objects. Further, for one embodiment, the horizontal and vertical step operations also support a skip specification that indicates a displacement in terms of microns or other units of measurement. Where the input list of objects is unordered, the abut operators may ignore all skip specifications for some embodiments.

The horizontal and vertical step operators of one embodiment, or a step operator without a specified direction, define a relative placement for the input list of objects along the control flow direction according to the specified bit structure. Along the control direction, the step operator takes a list of input objects and stacks them with each object starting at a unique bit position. For this operation, for one embodiment, multiple objects are prevented from spanning the same bit position.

For one embodiment, the step operators may support a stride and/or a skip specification. A stride specification indicates a certain number of bit positions to be skipped between every object in the input list. A skip specification indicates a number of bits to be skipped between two objects.

Similar to the abut operators described above, the input list for a step operator may be either ordered or unordered. Where the input list is unordered, the relative placement engine 255 may determine the order of the placement.

The relative placement engine 255 of one embodiment is designed such that each of the step and abut operators works with the bounding boxes of the input list. In this manner, the rigidity of any object in the input list is preserved during these operations regardless of whether the object(s) are specified as being rigid or non-rigid. Further, the bounding boxes of abutted or stepped objects for this embodiment do not intersect.

The bit structure of a group formed as a result of step and/or abut operations depends on the characteristics of the operands. For one embodiment, for example, if the data flow direction is vertical, horizontal abut operations result in a group with NULL bit structure even if all operands have valid bit structures. For the same example, vertical abut operations result in a group with NULL bit structure if all input objects do not have identical bit structures. If all operands have the same bit structure, then that bit structure is the bit structure of the parent object. Also for this example, a step operation results in a group with a NULL bit structure if one or more of the child objects has a null bit structure. If, however, all child objects have valid bit structures, then the resulting parent's bit structure is a concatenation of the child bit structures depending on the order in which the child objects are placed.

Figure 4:
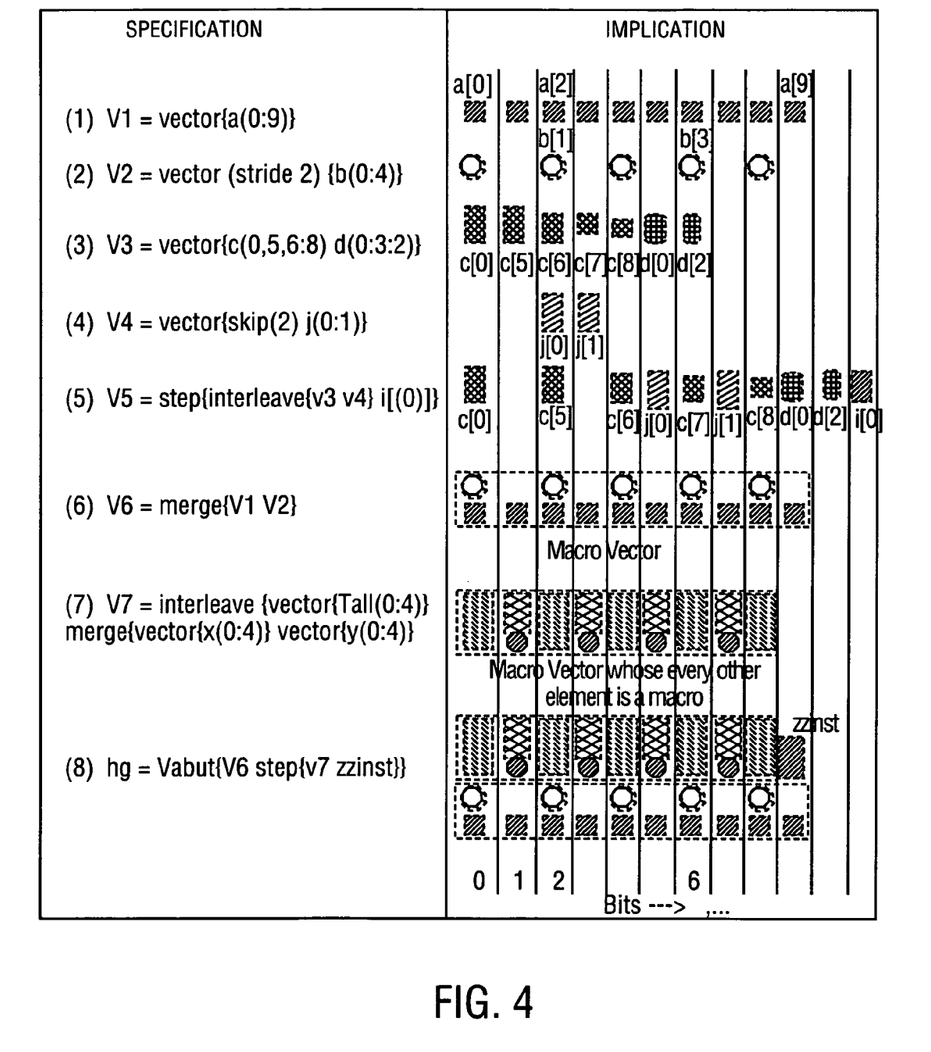
FIG. 4 is a diagram showing exemplary relative placement constraint expressions and corresponding graphical illustrations of the resulting objects.
Figure 5:
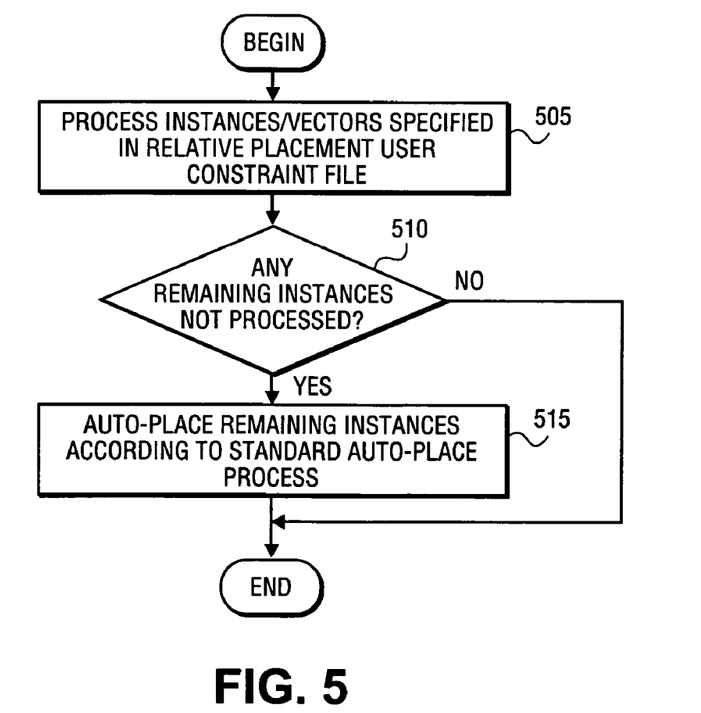
FIG. 5 is a flow diagram showing the operation of the automatic placement engine of one embodiment.

The interleave operator of one embodiment takes a list of vectors and groups as input and returns a new interleaved group with a span that is the sum of the spans of the input operands. An example of an interleave operation and a graphical illustration of a corresponding result are shown in FIG. 4 referenced below. For one embodiment, like the step operation, the relative placement engine 255 performs the interleave operation along the control flow direction.

For one embodiment, all input operands for an interleave operation must have a valid bit structure. The bit structure of the resulting group is then equal to the interleaved bit structure of the input operands. Further, the interleave operation of one embodiment assumes an ordered list of input operands.

The merge operator of one embodiment causes a bit wise merge of the contents of a list of vectors and/or groups. The new group that results from the merge is such that each bit location of the resultant group includes the collection of instances belonging to the respective bit location in each of the merged objects. The span of the resulting group is equal to the span of the object having the largest span of those being merged.

The merge operation of one embodiment can be performed on both ordered and unordered input operands with the relative placement engine 255 determining the order for unordered operands. For one embodiment, before performing a merge operation, the placement engine 255 expands any non-rigid input objects in the list of input operands to their rigid components. For an ordered merge, a simple packing of listed objects is then performed by the relative placement engine 255 to place the objects.

For one embodiment, the merge operation requires that the bit structures of the objects to be merged are compatible, i.e. the bit structures for corresponding bits of each of the objects, if they exist, are identical. The bit structure of the resulting group is the bit structure of the input object with the largest span.

For purposes of illustration, FIG. 4 provides exemplary specifications of relative placement constraints including some of the operators described. To the right of each of these expressions is a graphical representation of a corresponding result of the specified operation as performed by the relative placement engine 255 of one embodiment. For the example of FIG. 4, a standard unit (in terms of orientation) is shown. A 90 degree rotation of this figure essentially illustrates the effects of similar operations on a rotated unit.

The relative placement operations shown in FIG. 4 are specified using an exemplary syntax. It will be appreciated that other approaches to specifying relative placement operators that perform functions similar to those described above or similar to other relative placement operators that may be contemplated are within the scope of various embodiments.

Expression (1) shows an exemplary definition of a vector V1 that includes the instances a[0:9]. Expression (2) shows an exemplary definition of a vector V2 with a stride of 2 that includes the instances b[0:4]. Expression (3) is an exemplary definition of a vector V3 that includes instances c[0], c[5], and c[6:8] and every other element of d[0:3], i.e. d[0] and d[2].

With continuing reference to FIG. 4, expression (4) shows an exemplary definition of a vector V4 for which the first two bit positions are skipped and then the elements j[0:1] are included. Expression (5) is an exemplary definition of a vector V5 for which the relative placement of the specified objects is defined along the control direction using the "step" operator and for which the elements of the vectors V3 and V4 are interleaved and the element i(0) is added.

Expression (6) is an exemplary definition of a vector V6 for which the vectors V1 and V2 are merged. Expression (7) shows an exemplary definition of a vector for which the merged elements of a vector including instances x[0:4] and y[0:4] are interleaved with a vector including Tall[0:4]. For this example, Tall refers to the fact that the elements extend over multiple row sites. Finally, expression (8) shows an exemplary specification of a group hg that is formed by vertically abutting vector V6 with vector V7 and group zzinst along the control flow direction.

Referring back to FIGS. 2 and 3, for some embodiments, the relative placement engine 255 may also support mechanisms to specify absolute placement of objects and/or to open up spaces within objects.

Absolute placement constraints may be used, for example, to specify placement of objects that are child objects of a soft group. Such absolute placement constraints may be specified in terms of, for example, an absolute offset from the origin of the parent object or a bit position offset. Other types of absolute placement constraints may be supported by the relative placement engine 255 for other embodiments.

Spaces may be opened up within objects for the purposes of routing or for allocation of area for placement of another type of cell, for example. Spaces may be inserted into a group in several ways for one embodiment.

For example, a horizontal channel operator may be used to open up a horizontal routing channel that spans the length of the associated group. The desired horizontal channel may be specified in terms of a y-offset from the origin or one corner of the group and a height in microns or other units for the channel.

A vertical channel operator may be used to open up a vertical routing channel that spans the height of the associated group. The vertical channel operator may be used in conjunction with an x-offset from the origin or one corner of the group and a length of the channel in microns or other units. Other approaches for specifying a channel are within the scope of various embodiments.

An open bit operator may be used on groups that have a valid bit structure for one embodiment to open up a certain number of bit locations. The open bit locations may be specified using a start bit and a number of bits to be opened, for example.

An open space operator may be used to open a rectangular or other space anywhere within the associated group. For one embodiment, the open space may be specified in terms of its vertices, for example.

An open keep out region operator that is similar to the open space operator may also be used. For some embodiments, the open keep out region operator may be used to differentiate between a space that may be used for other types of cells (open space) and a space that may not be used by any cells (open keep out region).

For one embodiment, the above and/or other space insertion operations may be performed as a post-processing action after other relative placement operations are performed and resulting groups are generated. For this embodiment, legalization and bit structures are updated automatically after the requested spaces are inserted. Any objects that were originally in the region in which a space is created are pushed outside the space by the relative placement engine 255.

Other types of constraints that may be processed by the relative placement engine 255 include, for example, vector indexing constraints, vector and/or pin exclusion constraints, and/or net length and/or weight constraints.

Vector indexing constraints may be used to specify the index to be used during automatic vectorization for multiply indexed instance names. Vector and/or pin exclusion constraints may be used to specify a list of instances or pins to ignore during automatic vectorization. This may be useful because designs may often include instances that look like vectors to an automatic placement engine based on their names, for example, but that are not really vectors.

Net length and/or weight constraints may be used to specify a maximum length in microns or other units and/or additional weights or priorities for certain nets. These net length and/or weight constraints may be used to indicate to the relative placement engine 255 to pull the instances connecting timing critical nets closer together, for example.

While exemplary global options, object specifications, object types, group operators, absolute constraints and other types of specifications and constraints are described above, it will be appreciated that the relative placement engine 255 of various embodiments may support different types of specifications, object types, operators and/or constraints not described above or may not support all of the specifications, object types, operators and/or constraints described.

Referring back to FIG. 3, at block 325, the relative placement engine 255 automatically vectorizes the cell(s) smashed at block 315 in accordance with the constraints specified in the relative placement constraint file 257. For one embodiment, the relative placement engine 255 identifies the topcell of interest as a top level object and all other objects are considered to be descendents of the topcell. Thus, every object with the exception of the topcell object, has a parent group or object. For one embodiment, referring to FIG. 5, at block 505, the relative placement engine 255 first places instances, groups and/or vectors specified in the relative placement user constraint file 257 according to the user-specified constraints. Then, at block 510, it is determined whether there are any remaining instances that have not been processed. If so, then at block 515, these instances are considered to be part of the topcell object, which is then considered to be a soft group, and the relative placement engine proceeds to automatically place the remaining instances according to standard automatic placement procedures of a conventional automatic placement engine.

For one embodiment, because the user can specify relative placement constraints for some or all of the instances to be placed, the relative placement user constraint file 257 can either complement the automatic placement rules and judgments of a conventional automatic placement engine or completely replace them. For example, a designer may choose to specify relative placement constraints only for instances in the critical path and allow the conventional placement engine to automatically place remaining instances. Thus, the layout synthesis approach of one embodiment provides the designer with the flexibility to determine the desired level of control over the placement.

Referring back to FIG. 3, at block 330, a detailed placement is provided. At block 335, it is determined whether modifications to the placement are needed. If so, then at block 340, the relative placement user constraint file 257 may be modified and re-loaded at block 320. Once the detailed placement is acceptable, then at block 345, other design-related processes such as, for example, global routing, congestion analysis, pre-routing and/or detail routing may be performed.

For remaining topcells in the integrated circuit design, the above-described process may be repeated until a detailed placement has been produced for all topcells or other sub-units of the integrated circuit.

Figure 6:
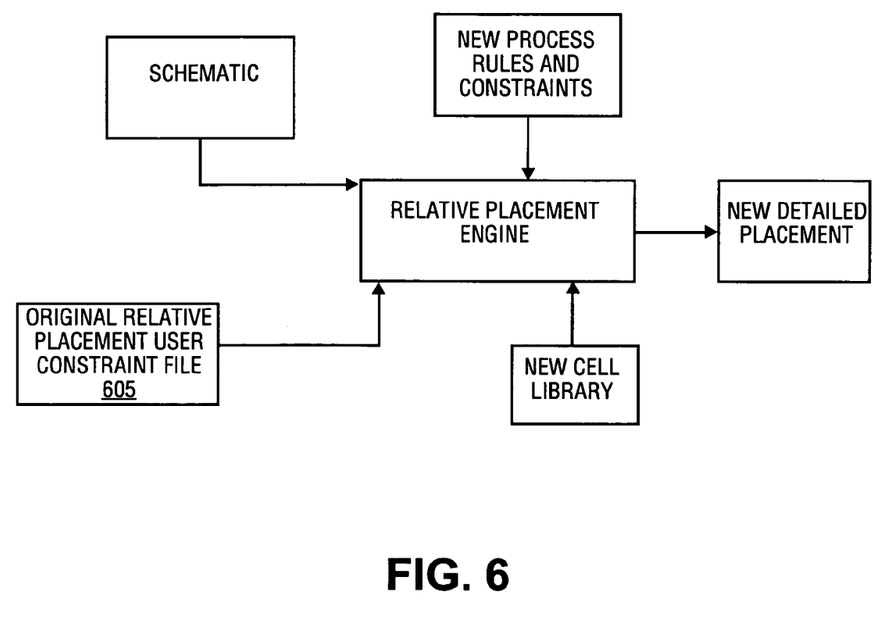
FIG. 6 is a block diagram showing an approach of one embodiment for producing a revised placement using previously specified user constraints.
Figure 7:
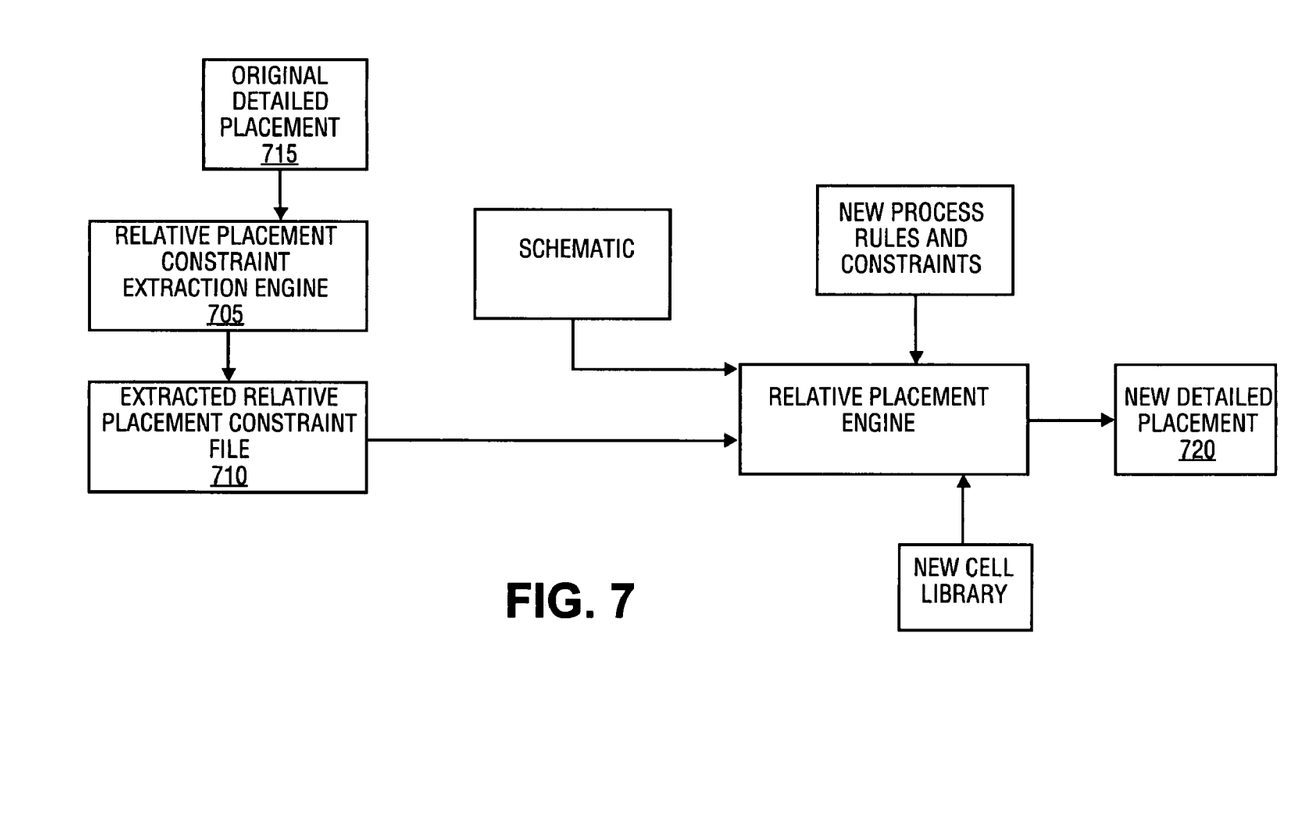
FIG. 7 is a block diagram showing an approach of another embodiment for producing a revised placement using previously specified user constraints.

In some circumstances, such as for a process shift, for example, it may be desirable to provide a new detailed placement for an existing design. Referring to FIG. 6, for one embodiment, where the relative placement user constraint file 605 from the original placement is available, the same file may be used again to perform the detailed placement for the new design. Alternatively, where the original relative placement user constraint file is not available for some reason, as shown in FIG. 7, a relative placement constraint extraction engine 705 may be used to extract relative placement constraints 710 from the original detailed placement 715 and use these constraints to provide the new detailed placement 720. In either case, the remainder of the placement methodology may be similar to the approaches described above.

Using these approaches, the original intent of the designers in terms of placement is preserved even through multiple design generations. This may help to reduce the number of placement iterations to achieve timing convergence on the new design.

Thus, a method and apparatus for layout synthesis of regular structures using relative placement is described. In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   receiving relative placement constraint information for a first design of an integrated circuit, receiving relative placement constraint information for the first design including receiving relative placement of a plurality of layout objects with respect to each other, wherein at least a first one of the plurality of layout objects is at a different level of hierarchy in the layout than at least a second one of the plurality of layout objects;
   receiving process and other constraints related to a second design for the integrated circuit;
   receiving a schematic specifying objects to be placed for the second design; and
   providing a detailed placement for the second design using the relative placement constraint information for the first design.

2. The method of claim 1 further comprising:
   extracting the relative placement constraint information for the first design from a detailed placement for the first design.

3. The method of claim 1 wherein
   receiving relative placement constraint Information for the first design includes receiving relative placement constraint Information for a first datapath; and
   wherein receiving the schematic specifying objects to be placed for the second design includes receiving the schematic specifying objects to be placed for a second datapath.

4. The method of claim 1 wherein providing a detailed placement for the second design using the relative placement constraint information for the first design includes
   automatically placing the plurality of layout objects according to the relative placement constraint Information, and
   automatically placing any remaining layout objects for an integrated circuit including the second design using a conventional placement engine.

5. The method of claim 4 wherein receiving the relative placement constraint information for the first design includes
   receiving information specifying global options, the global options including one or more of a boundary, a number of bits in a datapath, an orientation of a unit, a well-alignment direction, a rowsite height and a bit structure, and
   wherein automatically placing the plurality of layout objects includes applying the specified global options to each of the plurality of layout objects unless a conflicting object-specific constraint is received.

6. The method of claim 1 wherein receiving relative placement constraint information for the first design includes
   receiving information indicating a relative placement of a first layout object with respect to a second layout object wherein each of the first and second layout objects is one of an instance, group and vector.

7. The method of claim 6 wherein receiving relative placement constraint information for the first design includes
   receiving information indicating that the first layout object is to be placed relative to the second layout object according to one of a set of relative placement operations including horizontal step, vertical step, horizontal abut, vertical abut, interleave and merge.

8. The method of claim 7 further comprising creating a new group as a result of each of the set of relative placement operations wherein creating a new group comprises one of
   creating a hard group in which relative placement constraints are specified for each layout object in the hard group, and
   creating a soft group in which relative placement constraints are specified for fewer than every layout object in the soft group.

9. The method of claim 6 wherein receiving relative placement user constraint information for the first design includes
receiving absolute constraint information, the absolute constraint information including one of a space specification, a keep-out region specification and an open bit specification.

10. The method of claim 1 wherein receiving the relative placement user constraint information for the first design includes
receiving absolute constraint information, the absolute constraint information including one of a space specification, a keep-out region specification and an open bit specification.

11. The method of claim 1 wherein receiving relative placement constraint information for the first design includes
receiving information specifying global options, the global options including one or more of a boundary, a number of bits in a datapath, an orientation of a unit, a well-alignment direction, a rowsite height and a bit structure.

12. The method of claim 1 wherein receiving relative placement constraint information for the first design includes
receiving object-specific constraints, the object-specific constraints including one or more of a span, a bit structure, a well-alignment style, a rowsite height, a stride, a height and width and a rigidness indicator.

13. An apparatus comprising:
a relative placement engine to produce a first detailed placement of a first design in response to receiving a schematic specifying a plurality of layout objects, and
a set of user constraints including user constraints associated with a second design, the first design being a shrink of the second design, the user constraints specifying a placement of at least some of the layout objects relative to each other, at least one of the specified objects being at a different level of layout hierarchy than another one of the specified objects.

14. The apparatus of claim 13 further comprising:
a conventional placement engine coupled to the relative placement engine, the conventional placement engine to work with the relative placement engine to produce the detailed placement, the conventional placement engine to place any layout objects not specified in the user constraints.

15. The apparatus of claim 13 further comprising:
a constraint extraction engine to receive a second detailed placement associated with the second design and to extract the user constraints associated with the second design from the second detailed placement to be provided to the relative placement engine.

16. The apparatus of claim 15 wherein the extracted user constraints include
relative placement information indicating a relative placement of at least a first layout object with respect to at least a second layout object, wherein the first and second layout objects are each one of an instance, a group and a vector.

17. The apparatus of claim 16 wherein the extracted user constraints include
at least one relative placement operator from a set including a horizontal step operator, a vertical step operator, a horizontal abut operator, a vertical abut operator, an interleave operator and a merge operator.

18. The apparatus of claim 15 wherein the extracted user constraints include
an object-specific constraint from a set of object-specific constraints including span, bit structure, well-alignment style, rowsite height, stride, alignment guidelines, height, width and rigidness.

19. The apparatus of claim 18 wherein the extracted user constraints include
a global constraint from a set of global constraints including a boundary, an origin, a number of bits in a datapath, an orientation of a unit, a well-alignment direction and a rowsite height.

20. The apparatus of claim 19 wherein, if an object-specific constraint conflicts with a global constraint, the object-specific constraint takes precedence.

21. The apparatus of claim 15 wherein the extracted user constraints include
an absolute constraint from a set of absolute constraints including a space constraint, an obstacle constrain, an open bit constraint, a net length constraint, an absolute offset constraint, and a net width constraint.

22. An article of manufacture comprising a machine-accessible medium including data that, when accessed by a machine, cause the machine to:
receive relative placement constraint information for a first design for an integrated circuit, wherein receiving relative placement constraint information for the first design includes receiving relative placement of a plurality of layout objects with respect to each other, wherein at least a first one of the plurality of layout objects is at a different level of hierarchy in the layout than at least a second one of the plurality of layout objects;
receive process and other constraints related to a second design for the integrated circuit;
receive a schematic specifying objects to be placed for the second design; and
provide a detailed placement for the second design using the relative placement constraint information for the first design.

23. The article of manufacture of claim 22 wherein the machine-accessible medium further includes data that, when accessed by a machine, cause the machine to:
extract the relative placement constraint information for the first design from a detailed placement for the first design.

24. The article of manufacture of claim 22 wherein receiving relative placement constraint information for the first design includes receiving relative placement constraint information for a first datapath; and wherein receiving the schematic specifying objects to be placed for the second design includes receiving the schematic specifying objects to be placed for a second data path.

25. The article of manufacture of claim 22 wherein providing a detailed placement for the second design using the relative placement constraint information for the first design includes
automatically placing the plurality of layout objects according to the relative placement constraint information, and
automatically placing any remaining layout objects for an integrated circuit including the second design using a conventional placement engine.

26. The article of manufacture of claim 25 wherein receiving the relative placement constraint information for the first design includes receiving information specifying global options, the global options including one or more of a boundary, a number of bits in a datapath, an orientation of a unit, a well-alignment direction, a rowsite height and a bit structure, and wherein automatically placing the plurality of layout objects includes applying the specified global options to each of the plurality of layout objects unless a conflicting object-specific constraint is received.

27. The article of manufacture of claim 22 wherein receiving relative placement constraint information for the first design includes receiving information indicating a relative placement of a first layout object with respect to a second layout object wherein each of the first and second layout objects is one of an instance, group and vector.

28. The article of manufacture of claim 27 wherein receiving relative placement constraint information for the first design includes receiving information indicating that the first layout object is to be placed relative to the second layout object according to one of a set of relative placement operations including horizontal step, vertical step, horizontal abut, vertical abut, interleave and merge.

29. The article of manufacture of claim 28 wherein the machine-accessible medium further includes data that, when accessed by a machine, cause the machine to:

create a new group as a result of each of the set of relative placement operations wherein creating a new group comprises one of creating a hard group in which relative placement constraints are specified for each layout object in the hard group, and creating a soft group in which relative placement constraints are specified for fewer than every layout object in the soft group.

30. The article of manufacture of claim 27 wherein receiving relative placement user constraint information for the first design includes receiving absolute constraint information, the absolute constraint information including of a space specification, a keep-out region specification and an open bit specification.

31. The article of manufacture of claim 22 wherein receiving the relative placement user constraint information for the first design includes receiving absolute constraint information, the absolute constraint information including one of a space specification, a keep-out region specification and an open bit specification.

32. The article of manufacture of claim 22 wherein receiving relative placement constraint information for the first design includes receiving information specifying global options, the global options including one or more of a boundary, a number of bits in a datapath, an orientation of a unit, a well-alignment direction, a rowsite height and a bit structure.

33. The article of manufacture of claim 22 wherein receiving relative placement constraint information for the first design includes receiving object-specific constraints, the object-specific constraints including one or more of a span, a bit structure, a well-alignment style, a rowsite height, a stride, a height and width and a rigidness indicator.

* * * * *